United States Patent
Wu et al.

(10) Patent No.: US 7,253,524 B2
(45) Date of Patent: Aug. 7, 2007

(54) COPPER INTERCONNECTS

(75) Inventors: Zhen-Cheng Wu, Kaohsiung (TW);
Tzu-Jen Chou, Taipei (TW); Weng Chang, Taipei (TW); Yung-Cheng Lu, Taipei (TW); Syun-Ming Jang, Hsinchu (TW); Mong-Song Liang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/797,224

(22) Filed: Mar. 10, 2004

(65) Prior Publication Data

US 2005/0110153 A1 May 26, 2005

Related U.S. Application Data

(60) Provisional application No. 60/525,238, filed on Nov. 25, 2003.

(51) Int. Cl.
*H01L 23/48* (2006.01)
*H01L 23/52* (2006.01)
*H01L 29/40* (2006.01)

(52) U.S. Cl. ............... 257/762; 257/758; 257/E21.579; 438/672; 438/687

(58) Field of Classification Search ............... 257/774; 438/762, 687
See application file for complete search history.

(56) References Cited

U.S. PATENT DOCUMENTS

| | | | |
|---|---|---|---|
| 6,362,091 B1 * | 3/2002 | Andideh et al. ............ 438/624 |
| 6,455,417 B1 * | 9/2002 | Bao et al. .................... 438/637 |
| 6,537,733 B2 * | 3/2003 | Campana et al. ........... 430/313 |
| 6,617,690 B1 * | 9/2003 | Gates et al. ................. 257/758 |
| 6,674,146 B1 * | 1/2004 | Chow ......................... 257/508 |
| 6,734,116 B2 * | 5/2004 | Guo et al. ................... 438/792 |
| 6,753,260 B1 * | 6/2004 | Li et al. ..................... 438/700 |
| 2002/0068469 A1 * | 6/2002 | Andideh et al. ............ 438/967 |
| 2002/0100693 A1 * | 8/2002 | Lu et al. ..................... 205/157 |
| 2002/0140103 A1 * | 10/2002 | Kloster et al. .............. 257/767 |
| 2003/0224593 A1 * | 12/2003 | Wong ......................... 438/629 |
| 2004/0166674 A1 * | 8/2004 | Chen et al. ................. 438/687 |

OTHER PUBLICATIONS

Taiwan Search Report issued May 24, 2006.

\* cited by examiner

*Primary Examiner*—Evan Pert
*Assistant Examiner*—Benjamin P. Sandvik
(74) *Attorney, Agent, or Firm*—Thomas, Layden, Horstemeyer & Risley

(57) ABSTRACT

A semiconductor substrate has a first copper layer, on which an etch stop layer and a dielectric layer are successively formed. A second copper layer penetrates the dielectric layer and the etch stop layer to electrically connect to the first metal layer. The etch stop layer has a dielectric constant smaller than 3.5, and the dielectric layer has a dielectric constant smaller than 3.0.

6 Claims, 5 Drawing Sheets

TABLE 1

| | Film Properties | Example I | Example II | Example III | Example IV |
|---|---|---|---|---|---|
| Low-k IMD layer | $K_{IMD}$ value | 3.0 | 2.5 | 2.5 | 2.2 |
| | Tensile Stress (dynes/cm$^2$) | $5.0 \times 10^8$ | $4.0 \times 10^8$ | $4.0 \times 10^8$ | $1.7 \times 10^8$ |
| | Hardness (GPa) | 2.2 | 0.84 | 0.84 | 0.13 |
| | Modulus (GPa) | 15 | 8.4 | 8.4 | 3.7 |
| ES layer | $K_{ES}$ value | 4.5 | 4.5 | 3.0 | 4.5 |
| | Compressive Stress (dynes/cm$^2$) | $2.2 \times 10^9$ | $2.2 \times 10^9$ | $5.6 \times 10^8$ | $2.2 \times 10^9$ |
| Relative RC delay | | 1.3 | 1.11 | 1.05 | 1.0 |

COPPER INTERCONNECTS

CROSS REFERENCE TO RELATED APPLICATION

This application claims the full benefit and priority of provisional U.S. Patent Application Ser. No. 60/525,238, filed Nov. 25, 2003, entitled "Copper Interconnects", and incorporates the entire contents of said application herein.

BACKGROUND OF THE INVENTION

The invention relates to copper interconnects, and more particularly to copper interconnects including a low-k inter-metal dielectric (IMD) layer and a low-k etching stop (ES) layer.

As the density of semiconductor devices increases and the size of circuit elements becomes smaller to achieve better performance, resistance capacitance (RC) delay time in back-end-of-line (BEOL) increases and dominates circuit performance. To reduce RC delay time in BEOL, the demands on interconnects for connecting semiconductor devices to each other also increase. Copper interconnection has been adapted to silicon integrated circuits due to its low resistance and high electromigration reliability compared to traditional aluminum interconnection. Also, low-k dielectrics of dielectric constant (k) less than 3.5 have been used as inter-metal dielectrics (IMDs) for replacing traditional silicon-dioxide-based dielectrics.

Currently, single-damascene and dual-damascene methods are employed in copper interconnect processes. For patterning copper dual damascene interconnects (DDIs), a thin dielectric layer with high dielectric constant (k>4.5) is required to function as a via/trench etch stop (ES) layer and a copper diffusion/oxidation barrier. Such a high-k ES layer integrated with low-k IMD layers, however, results in a substantially increased dielectric constant of the combined dielectric layers. Consequently, when electric currents are conducted through the copper interconnects, a large parasitic capacitance would occur in the low-k IMD layer. This parasitic capacitance will then cause an increased RC delay to the signals being transmitted through the copper interconnects, thus degrading the performance of the IC device.

In order to meet RC delay requirements, a porous low-k material of a smaller dielectric constant (k<2.5), such as organo-silicate glass (OSG), has been employed as the IMD layer and integrated with the high-k ES layer in the copper dual damascene process. One drawback, however, is that the porous low-k material has weak mechanical properties, including low film hardness (less than 0.2 GPa) and low elastic modulus (less than 5 GPa), causing high process cost, high process risk, and poor reliability.

In addition, the conventional ES structure is a single layer with a high etching selectivity to the IMD layer in order to protect the underlying copper layer from oxidation due to moisture and exposure to air. The via etching process, however, easily breaks through the single-layer ES structure due to variation in IMD thickness, isolation/dense pattern effect, micro-loading effect and feature size reduction. This causes the ES structure failure and damages to the underlying copper layer in subsequent etching/ashing processes, thus degrading uniformity and reliability of the copper interconnection.

SUMMARY

Accordingly, an object of the present invention is to provide high performance copper interconnects with a low-k ES layer (1.0<k<3.5) and a low-k IMD layer (1.0<k<3.0) to achieve excellent resistance to stress induced voiding (SIV) and reduce RC delay time at BEOL.

Another object of the present invention is to provide an ES layer including a first ES layer of a first etching selectivity and a second ES layer of a second etching selectivity, thus a failure of the ES layer is prevented during etching process.

According to the object of the invention, a semiconductor substrate has a first metal layer, on which an etch stop layer and a dielectric layer are successively formed. A second metal layer penetrates the dielectric layer and the etch stop layer to electrically connect to the first metal layer. The etch stop layer has a dielectric constant smaller than 3.5, and the dielectric layer has a dielectric constant smaller than 3.0. Also, the etch stop layer includes a first ES layer of a first etching selectivity S1 and a second ES layer of a second etching selectivity S2, in which $S_1 \neq S_2$, and at least one of $S_1$ and $S_2$ is larger than zero.

BRIEF DESCRIPTION OF THE DRAWINGS

The present invention will become more fully understood from the detailed description given hereinbelow and the accompanying drawings, given by way of illustration only and thus not intended to be limitative of the present invention.

Table 1 illustrates low-k IMD layers with various KIMD values integrated with a high-k ES layer ($k_{ES}$=4.5) and a low-k ES layer ($k_{ES}$=3.0) to compare RC delay results and mechanical properties of the copper dual damascene structure.

DESCRIPTION

The present invention provides a copper interconnect structure with a low-k ES layer (1.0<k<3.5) and a low-k IMD layer (1.0<k<3.0) to reduce RC delay and optimize film-stacked mechanical properties. Particularly, the low-k ES layer has a low compressive stress (0~1×10$^9$ dynes/cm$^2$), and the low-k IMD layer has strong mechanical properties including high film hardness (greater than 0.2 GPa) and high elastic modulus (greater than 5 GPa). Also, the compressive stress of the low-k ES layer approximates to the tensile stress of the low-k IMD layer, thus diminishing the stress difference therebetween. Accordingly, the low-k ES layer integrated with the low-k IMD layer in the copper interconnect structure achieves the advantages of high via-EM endurance, better adhesion between copper and the ES layer, smaller leakage between copper interconnects, reduced RC delay and compatibility with current ES processes.

The copper interconnect is applied to both single-damascene and dual-damascene processes. The dual-damascene technology has advantages of reducing process steps and lowering cost, therefore a copper dual damascene structure is chosen to describe this invention. It should be noted, however, that this invention applies also to the single-damascene technology.

FIRST EMBODIMENT

Figure 1:
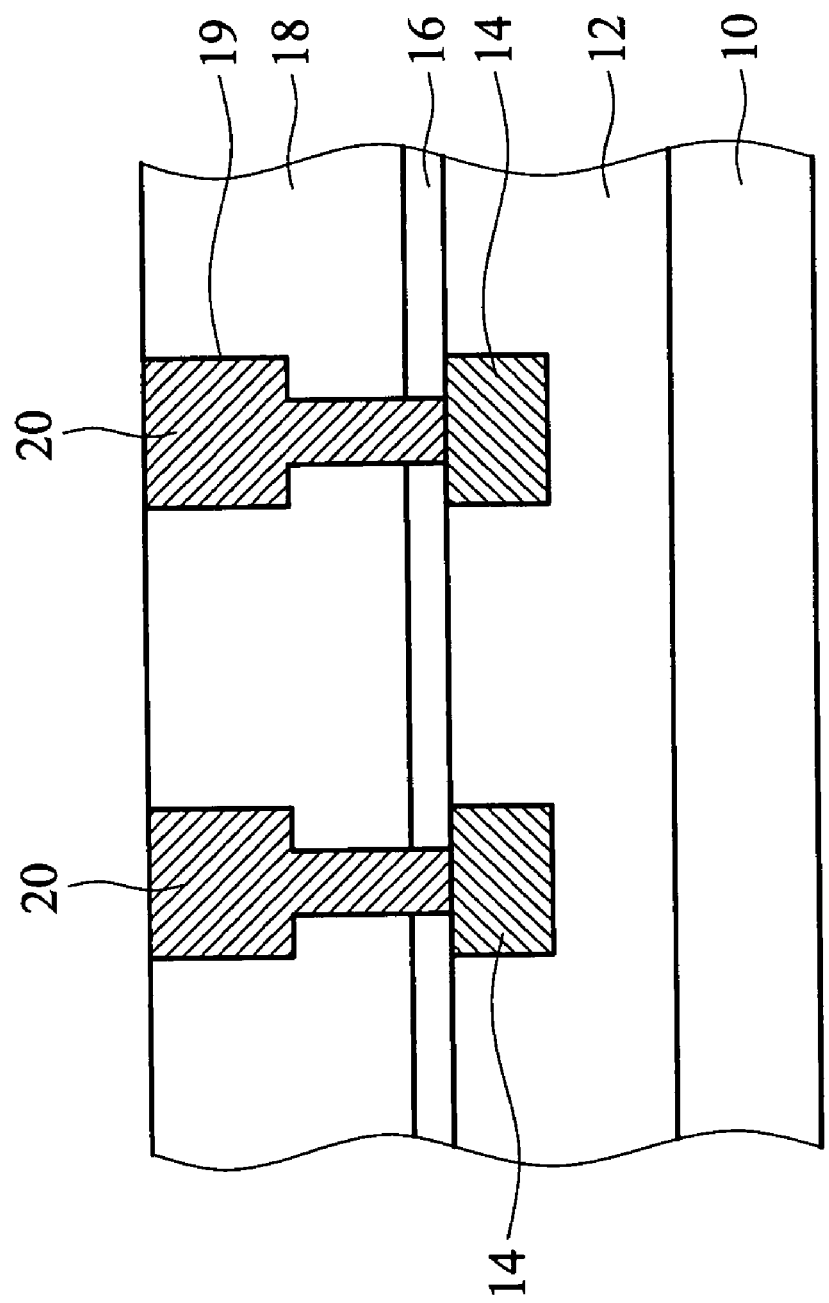
FIG. 1 is a cross-section of a copper dual damascene structure according to the first embodiment of the present invention.

FIG. 1 is a cross-section of a copper dual damascene structure according to the first embodiment of the present invention.

A semiconductor substrate 10 is provided, possibly containing, for example, transistors, diodes, other semiconductor elements as well known in the art, and other metal interconnect layers. A dielectric layer 12 is formed overlying the semiconductor substrate 10, and a copper wiring layer 14 is patterned on the dielectric layer 12. The copper wiring layer 14 may be replaced by a variety of materials, such as aluminum, aluminum alloyed with silicon or copper, copper alloys, and multilayer structures including a Ti layer, a TiN layer and an AlCu layer. An etch stop (ES) layer 16 is formed overlying the copper wiring layer 14 and the dielectric layer 12 to serve as a via/trench etch stopper and a copper diffusion/oxidation barrier. An inter-metal dielectric (IMD) layer 18 is formed overlying the ES layer 16. A dual damascene opening 19, including a via and a trench, is formed to penetrate the IMD layer 18 and the ES layer 16 until the copper wiring layer 14 is exposed. The dual damascene opening 19 filled with a copper material serves as a copper dual damascene structure 20.

Preferably, the ES layer 16 is a low-k dielectric layer with a dielectric constant $k_{Es}$ satisfying the formula: $1.0<k_{ES}<3.5$. Also, the ES layer 16 has a low compressive stress of approximately $0\sim1\times10^9$ dynes/cm$^2$. The IMD layer 18 is a low-k dielectric layer with a dielectric constant $k_{IMD}$ satisfying the formula: $1.0<k_{IMD}<3.0$. Also, the IMD layer 18 has strong mechanical properties, including a high film hardness greater than 0.2 GPa, and a high elastic modulus greater than 5 GPa. Moreover, the compressive stress of the ES layer 16 approximates to the tensile stress of the IMD layer 18, thus diminishing the stress difference therebetween and achieving good reliability of the copper dual damascene structure 20.

Referring to Table 1, low-k IMD layers with various $k_{IMD}$ values ($k_{IMD}$=3, 2.5, 2.5, 2.2) are integrated with a high-k ES layer ($k_{ES}$=4.5) and a low-k ES layer ($k_{ES}$=3.0) to compare RC delay results and mechanical properties of the copper dual damascene structure.

In example I, a high-k ES layer of $k_{ES}$=4.5 integrated with a low-k IMD layer of $k_{IMD}$=3.0 results in a substantially increased dielectric constant of the combined dielectric layers, thus increasing RC delay time and degrading the performance of the IC device. Although the low-k IMD layer of $k_{IMD}$=3.0 has strong mechanical properties, a stress difference between the compressive stress of the high-k ES layer and the tensile stress of the low-k IMD layer is very large and does not meet copper reliability requirements. Similarly, in example II, the high-k ES layer of $k_{ES}$=4.5 integrated with the low-k IMD layer of $k_{IMD}$=2.5 encounters the problems of increased RC delay time and poor copper reliability.

In example IV, a high-k ES layer of $k_{ES}$=4.5 integrated with a lower-k IMD layer of $k_{IMD}$=2.2 results in a substantially decreased dielectric constant of the combined dielectric layers, thus decreasing RC delay time and elevating the performance of the IC device. The lower-k IMD layer of $k_{IMD}$=2.2, however, has poor mechanical properties including low film hardness and low elastic modulus, thus encountering process risks, such as packaging, peeling, pore sealing, etch/ash damage and trench profile roughing, associated with a porous dielectric material with a very small k value.

In addition, the tensile/compressive stress difference issue between the high-k ES layer and the low-k IMD layer is not overcome.

Compared with example I and example II, in example III, a low-k ES layer of $k_{ES}$=3.0 integrated with a low-k IMD layer of $k_{IMD}$=2.5 results in a substantially decreased dielectric constant of the combined dielectric layers, thus decreasing RC delay time and elevating the performance of the IC device. Also, the compressive stress of the low-k ES layer approximates to the tensile stress of the low-k IMD layer, thus diminishing the stress difference therebetween and achieving good reliability of the copper dual damascene interconnect. Moreover, compared with example IV, the low-k IMD layer of $k_{IMD}$=2.5 used in example III provides better mechanical properties, such as higher film hardness and higher elastic modulus, thus achieving lower process cost and risks for the copper interconnects with comparable RC delay time and further improving reliability of the copper interconnects.

According to the above-described experimental results, 15% RC delay reduction is achieved by reducing the $k_{IMD}$ value from 3.0 to 2.5 with the high-k ES layer ($k_{ES}$=4.5). Subsequently reducing the $k_{ES}$ value from 4.5 to 3.0 with the low-k IMD layer ($k_{IMD}$=2.5), another 6% RC delay reduction is further achieved and approximates to the RC delay reduction gained from using the lower-k IMD layer ($k_{IMD}$=2.2) with a high-k ES layer ($k_{ES}$=4.5). Consequently, the copper interconnects employing the low-k ES layer and the low-k IMD layer can reach an expected RC delay reduction and bypass many integration hurdles.

For many applications of the low-k IMD layer ($1.0<k_{IMD}<3.0$) with strong mechanical properties, a porous low-k dielectric material is preferred, such as porous organosilicate glass (OSG). For many applications of the low-k ES layer ($1.0<k_{ES}<3.5$) with low compressive stress ($0\sim1\times10^9$ dynes/cm$^2$), an oxygen-doped silicon carbide (SiOC) layer is preferred. A fabrication method for depositing a low-k SiOC layer of k=3.0 with a low compressive stress ($5.6\times10^8$ dynes/cm$^2$) includes the following deposition conditions. In a plasma enhanced chemical vapor deposition (PECVD) treatment, the gas precursor includes SiH—(CH$_3$)$_3$ with a flow rate of 50~300 sccm and CO$_2$ with a flow rate of 300~500 sccm, the process temperature is 350~400° C., the process pressure is 8~10 Torr, the process time is 20~30 seconds, the high-frequency (HF) RF power is 300~500W, and the low-frequency (LF) RF power is 60~200W.

SECOND EMBODIMENT

Figure 2:
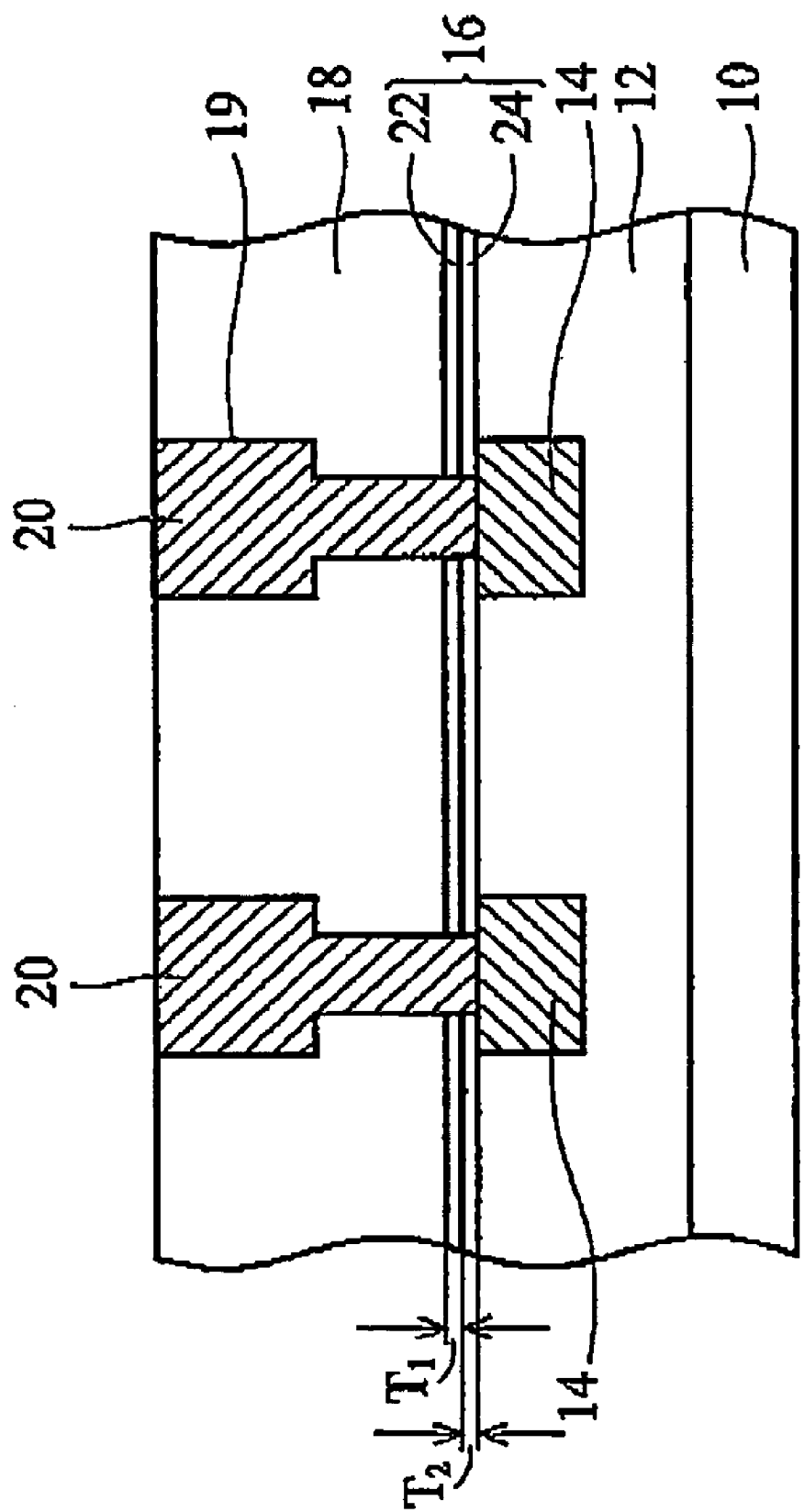
FIG. 2 is a cross-section of a copper dual damascene structure according to the second embodiment of the present invention.

FIG. 2 is a cross-section of a copper dual damascene structure according to the second embodiment of the present invention.

Elements in the second embodiment are substantially similar to those of the first embodiment, and the similar portions omitted herein. The difference is that the ES layer 16 is a composite film including a first ES layer 22 and a second ES layer 24. A first etching selectivity $S_1$ of the first ES layer 22 to the IMD layer 18, and a second etching selectivity $S_2$ of the second ES layer 24 to the IMD layer 18 satisfy the formulas: $S_1 \neq S_2$, wherein at least one of $S_1$ and $S_2$ is larger than zero. Preferably, $S_1$ and $S_2$ satisfy the formula: $0<S_1<S_2$. A first thickness $T_1$ of the first ES layer 22 and a second thickness $T_2$ of the second ES layer 24 satisfy the formula: $T_2<(T_1+T_2)/3$. Based on the limitations in etching selectivity, each of the first ES layer 22 and the second ES layer 24 may be SiCN, SiCO, SiN, SiON, SiC, SiO, or the combination thereof. For instance, if the second ES layer 24/the first ES layer 22 scheme is a SiN/SiCO structure, a SiCO/SiCO structure or a SiC/SiO structure may be used.

Figure 3:
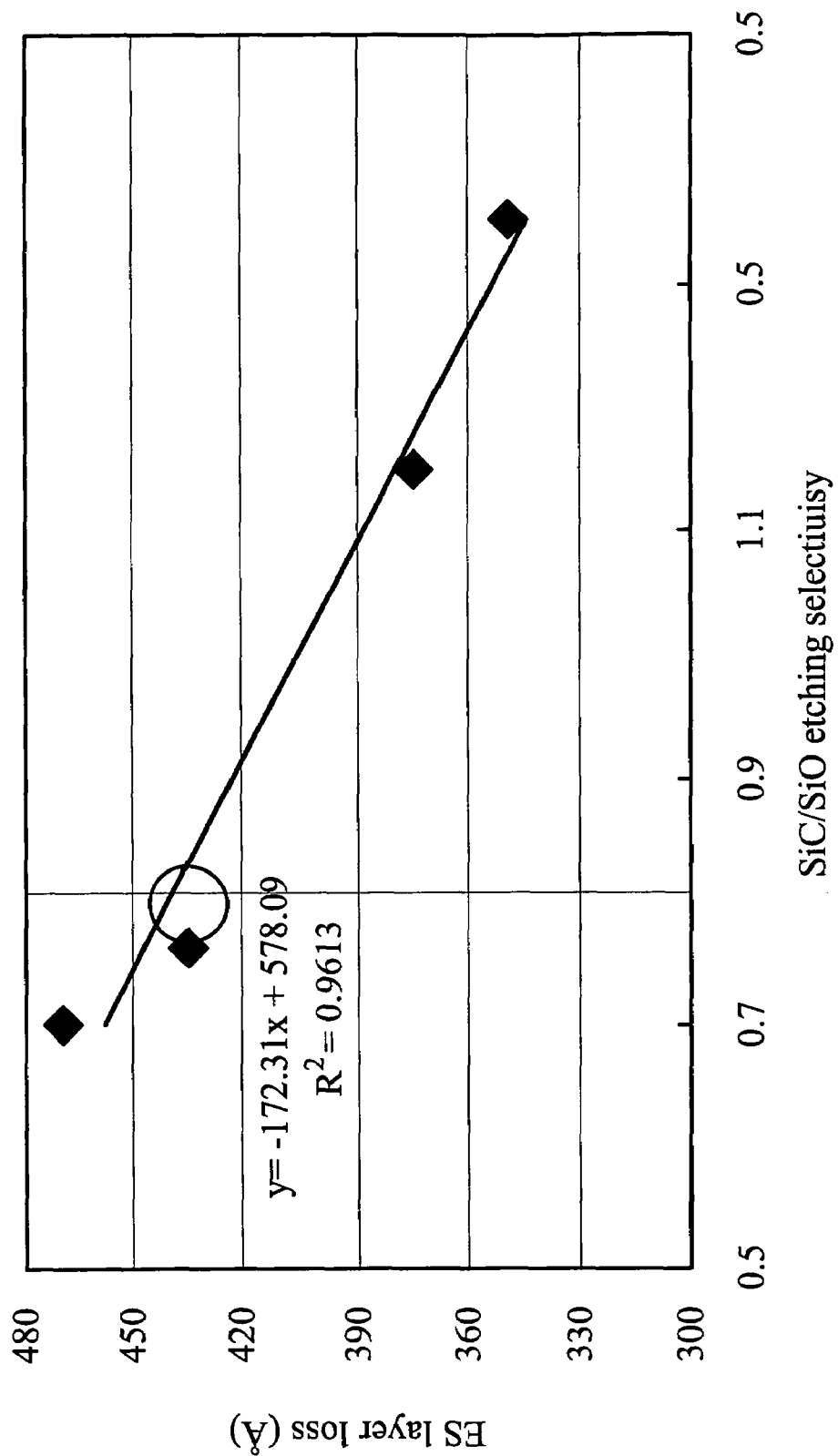
FIG. 3 is a graph illustrating SiC/SiO etching selectivity ratio corresponding to thickness loss of the ES layer.
Figure 4:
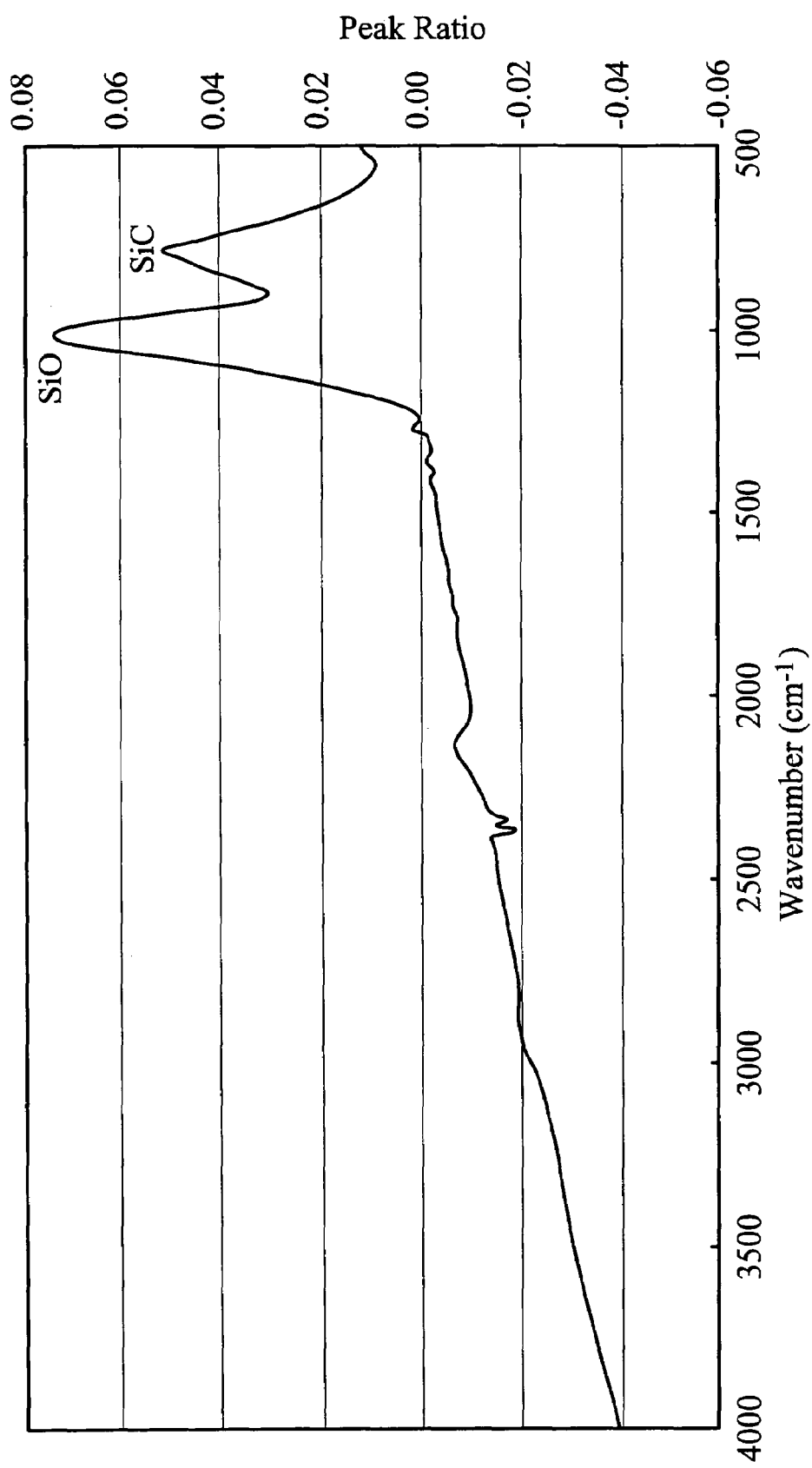
FIG. 4 is FTIR absorption spectra of SiC and SiO.

Preferably, the ES layer 16 is a SiCO-based composite deposition, in which the first ES layer 22 and the second ES layer 24 may be in-situ deposited or ex-situ deposited. A SiC/SiO structure is preferably used for the ES layer 16 as shown by the following experimental results. FIG. 3 is a graph illustrating SiC/SiO etching selectivity ratio corresponding to thickness loss of the ES layer. FIG. 4 is FTIR absorption spectra of SiC and SiO. A first thickness $T_1$ of the SiC film and a second thickness $T_2$ of the SiO film satisfy the formula: $T_2<(T_1+T_2)/3$. In FTIR spectra, a first peak ratio $R_1$ of the SiC film and a second peak ratio $R_2$ of the SiO film satisfy the formula: $R_2>R_1+0.05$.

Compared with the conventional single ES layer, the second embodiment employs the first ES layer 22 and the second ES layer 24 with different etching selectivity to prevent the ES layer 16 from being broken through during the via etching process. Thus, damage to the underlying copper wiring layer 14 is prevented in subsequent etching/ashing processes. The ES layer of SiOC-based composite film has compatibility with current ES processes, and improves uniformity and reliability of the copper interconnects.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a semiconductor substrate;
    a first metal layer formed overlying the semiconductor substrate;
    a composite etch stop layer, comprising a first etch stop layer overlying a second etch stop layer, formed overlying the first metal layer and the semiconductor substrate;
    a dielectric layer formed overlying the etch stop layer; and
    a second metal layer penetrating the dielectric layer and the etch stop layer and electrically connected to the first metal layer;
    wherein, the etch stop layer has a dielectric constant smaller than 3.5;
    wherein, the dielectric layer has a dielectric constant smaller than 3.0;
    wherein the dielectric layer has a tensile stress approximating to the compressive stress of the etch stop layer;
    wherein the first etch stop layer is a SiCO film, and the second etch stop layer is a SiCO film;
    wherein a first etching selectivity $S_1$ of the first etch stop layer to the dielectric layer, and a second etching selectivity $S_2$ of the second etch stop layer to the dielectric layer satisfy the formula: $S_1 \neq S_2$.

2. The semiconductor device of claim 1, wherein the etch stop layer has a compressive stress of $0\sim1\times10^9$ dynes/cm$^2$.

3. The semiconductor device of claim 1, wherein the dielectric layer has a film hardness greater than 0.2 GPa and an elastic modulus greater than 5 GPa.

4. The semiconductor device of claim 1, wherein $S_1$ and $S_2$ satisfy the formula: $0<S_1<S_2$.

5. The semiconductor device of claim 1, wherein a first thickness $T_1$ of the first etch stop layer and a second thickness $T_2$ of the second etch stop layer satisfy the formula: $T_2<(T_1+T_2)/3$.

6. A fabrication method for a semiconductor device, comprising the steps of:
    providing a semiconductor substrate having a first metal layer;
    forming an etch stop layer overlying the first metal layer and the semiconductor substrate, wherein the etch stop layer has a dielectric constant smaller than 3.5;
    forming a dielectric layer overlying the etch stop layer, wherein the dielectric layer has a dielectric constant smaller than 3.0;
    forming an opening which penetrates the dielectric layer and the etch stop layer and exposes the first metal layer; and
    forming a second metal layer in the opening, in which the second metal layer is electrically connected to the first metal layer, wherein the etch stop layer is a SiOC layer, and forming the etch stop layer is by a plasma enhanced chemical vapor deposition having:
    SiH—(CH$_3$)$_3$ with a flow rate of 50~300 sccm;
    CO$_2$ with a flow rate of 300~500 sccm;
    a process temperature of 350~400° C.;
    a process pressure of 8~10 Torr;
    a high-frequency (HF) RF power of 300~500 W; and
    a low-frequency (LF) RF power of 60~200 W.

* * * * *